(12) United States Patent  (10) Patent No.: US 9,184,335 B2
Hwang et al.  (45) Date of Patent: Nov. 10, 2015

(54) SEMICONDUCTOR LIGHT EMITTING DEVICE AND METHOD OF MANUFACTURING THE SAME

(71) Applicant: Samsung Electronics Co., Ltd., Suwon-si (KR)

(72) Inventors: Kyung Wook Hwang, Hwaseong-si (KR); Sam Mook Kang, Osan-si (KR); Han Kyu Seong, Seoul (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/153,442

(22) Filed: Jan. 13, 2014

(65) Prior Publication Data

US 2014/0206116 A1   Jul. 24, 2014

(30) Foreign Application Priority Data

Jan. 24, 2013   (KR) .................. 10-2013-0008311

(51) Int. Cl.
  *H01L 33/00* (2010.01)
  *H01L 33/24* (2010.01)
(52) U.S. Cl.
  CPC .............. *H01L 33/005* (2013.01); *H01L 33/24* (2013.01)
(58) Field of Classification Search
  CPC .............................. H01L 33/005; H01L 33/00
  USPC .......................................................... 438/29
  See application file for complete search history.

(56) References Cited

U.S. PATENT DOCUMENTS

| 8,039,854 B2 | 10/2011 | Hersee et al. |
| 8,227,817 B2 | 7/2012 | Pedersen et al. |
| 2008/0012030 A1 | 1/2008 | Yoon et al. |
| 2009/0169828 A1* | 7/2009 | Hersee et al. ............ 428/172 |
| 2010/0163840 A1* | 7/2010 | Seifert et al. ............... 257/13 |
| 2010/0283064 A1 | 11/2010 | Samuelson et al. |
| 2011/0143472 A1 | 6/2011 | Seifert et al. |
| 2011/0240959 A1 | 10/2011 | Konsek et al. |
| 2011/0309382 A1 | 12/2011 | Lowgren |
| 2012/0153252 A1 | 6/2012 | Kim et al. |

FOREIGN PATENT DOCUMENTS

| KR | 10-2012-0052651 A | 5/2012 |
| KR | 10-2012-0055390 A | 5/2012 |
| KR | 10-2012-0058137 A | 6/2012 |

OTHER PUBLICATIONS

English translation of Seong (KR1020120052651, 2012: previously made of record of IDS).*

* cited by examiner

*Primary Examiner* — Asok K Sarkar
*Assistant Examiner* — Dmitriy Yemelyanov
(74) *Attorney, Agent, or Firm* — Muir Patent Law, PLLC

(57) ABSTRACT

There are provided a semiconductor light emitting device and a method of manufacturing the same. A method of manufacturing a plurality of light emitting nanostructures of a semiconductor light emitting device includes: forming a plurality of first conductivity type semiconductor cores on a first type semiconductor seed layer, each first conductivity type semiconductor core formed through an opening in an insulating film; forming an active layer on each first conductivity type semiconductor core; forming, using a mask pattern, a second conductivity type semiconductor layer on each active layer to cover the active layer, to form a plurality of light emitting nanostructures; and forming an electrode on the plurality of light emitting nanostructures.

8 Claims, 6 Drawing Sheets

SEMICONDUCTOR LIGHT EMITTING DEVICE AND METHOD OF MANUFACTURING THE SAME

CROSS-REFERENCE TO RELATED APPLICATIONS

This application claims the priority of Korean Patent Application No. 10-2013-0008311 filed on Jan. 24, 2013, in the Korean Intellectual Property Office, the disclosure of which is incorporated herein by reference.

TECHNICAL FIELD

The present disclosure relates to a semiconductor light emitting device and a method of manufacturing the same.

BACKGROUND

A semiconductor light emitting device such as a light emitting diode (LED) or the like is a device emitting light through a material contained therein. LEDs convert energy generated through electron-hole recombination occurring at p-n junctions between p-type and n-type semiconductors into light to be emitted therefrom. Such LEDs have been widely used as light sources in lighting devices, display devices, and the like, and the development thereof is being accelerated.

In particular, as mobile phone keypads, turn signal lamps, camera flashes and the like using GaN-based LEDs are commercialized, the development of general lighting devices using LEDs is being actively undertaken. As the use of LEDs is extended from small portable devices to large, high output, and high efficiency products such as the backlight units of large screen TVs, the headlights of vehicles, general lighting devices, light sources having the characteristics required by the corresponding products have been demanded.

As the use of semiconductor light emitting devices is increased, a method of improving light extraction efficiency thereof is particularly beneficial.

SUMMARY

An aspect of the present disclosure provides a semiconductor light emitting device and a method of manufacturing the same capable of improving light extraction efficiency.

In one embodiment, a method of manufacturing a semiconductor light emitting device includes preparing a substrate; forming a first conductivity type semiconductor base layer on the substrate; forming an insulating film having a plurality of openings on the first conductivity type semiconductor base layer, the openings allowing the first conductivity type semiconductor base layer to be selectively exposed; forming a plurality of first conductivity type semiconductor cores on portions of the first conductivity type semiconductor base layer exposed through the plurality of openings, each of the first conductivity type semiconductor cores formed to have either a rod shape or a pyramid shape; forming an active layer on a surface of each of the first conductivity type semiconductor cores; and forming a second conductivity type semiconductor layer on the active layer for each first conductive type semiconductor core to enclose the active layer, the second conductivity type semiconductor layer for each first conductive type semiconductor core having a dome shape. Each first conductivity type semiconductor core together with a respective active layer and a respective second conductivity type semiconductor layer sequentially formed thereon forms a light emitting nanostructure such that the light emitting device includes a plurality of light emitting nanostructures.

In one embodiment, the method further includes forming an electrode on the plurality of light emitting nanostructures, to cover the plurality of light emitting nanostructures, wherein the electrode contacts the second conductive type semiconductor layer for each light emitting nanostructure. The electrode may be formed to contact the insulating film.

The electrode may be a reflective electrode formed of a reflective material that reflects light received from the active layer back toward the active layer. Alternatively, the electrode may be a transparent electrode formed of a transparent material that permits light received from the active layer to pass through the electrode toward the outside of the semiconductor light emitting device.

In one embodiment, a method of manufacturing a semiconductor light emitting device includes preparing a substrate; forming a first conductivity type semiconductor base layer on the substrate; forming an insulating film having a plurality of openings on the first conductivity type semiconductor base layer such that the first conductivity type semiconductor base layer is disposed between the substrate and the insulating film, the openings allowing the first conductivity type semiconductor base layer to be selectively exposed; forming a plurality of first conductivity type semiconductor cores on portions of the first conductivity type semiconductor base layer exposed through the plurality of openings; forming an active layer on a surface of each of the first conductivity type semiconductor cores; and forming a second conductivity type semiconductor layer on the active layer to surround at least a first conductivity type semiconductor core and its corresponding active layer. Each first conductivity type semiconductor core together with a respective active layer and a respective second conductivity type semiconductor layer sequentially formed thereon forms a light emitting nanostructure. In addition, an outer lateral surface of a first conductive type semiconductor core at a first vertical region of a light emitting nanostructure has a first cross-sectional profile, and an outer lateral surface of the second conductivity type semiconductor layer at the first vertical region of the light emitting nanostructure has a second cross-sectional profile different from the first cross-sectional profile.

In one embodiment, the first cross-sectional profile at the first vertical region includes a curved shape, and the second cross-sectional profile at the first vertical region does not include a curved shape.

In one embodiment, the first cross-sectional profile at the first vertical region includes a first side that has a first angle of inclination with respect to a surface of the substrate, and the second cross-sectional profile at the first vertical region includes a second side that has a second angle of inclination with respect to the surface of the substrate, the first angle of inclination being larger than the second angle of inclination.

The first conductivity type semiconductor base layer may be continuously formed with the plurality of first conductivity type semiconductor cores, through the openings in the insulating film.

In one embodiment, the forming of the second conductivity type semiconductor layer includes: forming the second conductivity type semiconductor layer while filling a space between the first conductivity type semiconductor cores; and etching the second conductivity type semiconductor layer etching the second conductivity type semiconductor layer so as to allow the outer surface of the second conductivity type semiconductor layer at the first vertical region to have the second cross-sectional profile different from the first cross-sectional profile.

In one embodiment, the etching of the second conductivity type semiconductor layer includes: forming a photoresist pattern having a desired shape on the second conductivity type semiconductor layer in positions corresponding to the first conductivity type semiconductor cores; and etching the second conductivity type semiconductor layer together with the photoresist pattern so as to divide the second conductivity type semiconductor layer into respective light emitting nanostructures.

In one embodiment, the etching of the second conductivity type semiconductor layer is performed until the insulating film is exposed, such that the second conductivity type semiconductor layer is divided into respective light emitting nanostructures.

In one embodiment, a shape of the first conductivity type semiconductor core may be a rod shape, a hexagonal pyramid shape, or a combination thereof.

In one embodiment, a surface of at least a portion of the second conductivity type semiconductor layer is formed as a curved surface. For example, the surface may form a dome shape.

In one embodiment, an angle of inclination between a top surface of the first conductivity type semiconductor base layer and the outer surface of the second conductivity type semiconductor layer at the first vertical region of a first light emitting nanostructure is less than that between the top surface of the first conductivity type semiconductor base layer and the outer surface of the first conductivity type semiconductor core at the first vertical region of the first light emitting nanostructure.

In one embodiment, the method additionally includes forming an electrode on the second conductivity type semiconductor layer, wherein the electrode is one of a reflective electrode and a transparent electrode.

In one embodiment, a method of manufacturing a plurality of light emitting nanostructures of a semiconductor light emitting device includes: forming a plurality of first conductivity type semiconductor cores on a first type semiconductor seed layer, each first conductivity type semiconductor core formed through an opening in an insulating film; forming an active layer on each first conductivity type semiconductor core; forming, using a mask pattern, a second conductivity type semiconductor layer on each active layer to cover the active layer, to form a plurality of light emitting nanostructures; and forming an electrode on the plurality of light emitting nanostructures.

The electrode may be a transparent electrode, or may be a reflective electrode.

In another embodiment, a semiconductor light emitting device includes: a substrate; a first conductivity type semiconductor base layer formed on the substrate; and a plurality of light emitting nanostructures spaced apart from one another, each light emitting nanostructure including a first conductivity type semiconductor core formed on the first conductivity type semiconductor base layer, and an active layer and a second conductivity type semiconductor layer sequentially formed on a surface of the first conductivity type semiconductor core. A lateral surface of the first conductivity type semiconductor core when viewed as a cross-sectional profile at a first vertical range has a non-curved shape, and a lateral surface of the second conductivity type semiconductor layer when viewed as a cross-sectional profile at the first vertical range has a curved shape.

The surface of the second conductivity type semiconductor layer when viewed as a cross-sectional profile may form a dome shape.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
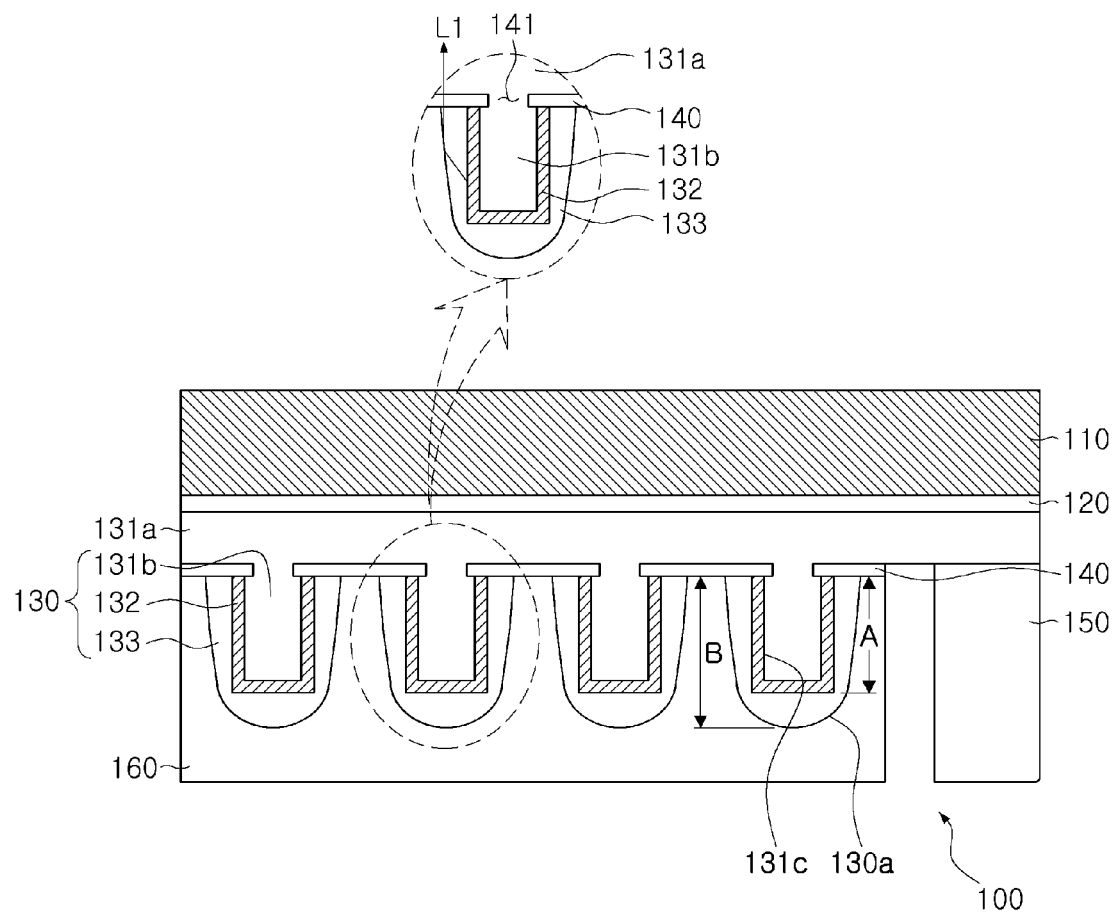
FIG. 1 is a cross-sectional view illustrating a semiconductor light emitting device according to one exemplary embodiment.

Embodiments of the present disclosure will now be described in detail with reference to the accompanying drawings.

The inventive concept of the disclosure may, however, be exemplified in many different forms and should not be construed as being limited to the specific embodiments set forth herein.

In the drawings, the shapes and dimensions of elements may be exaggerated for clarity, and the same reference numerals will be used throughout to designate the same or like elements.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and unless the context indicates to the contrary, the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 8:
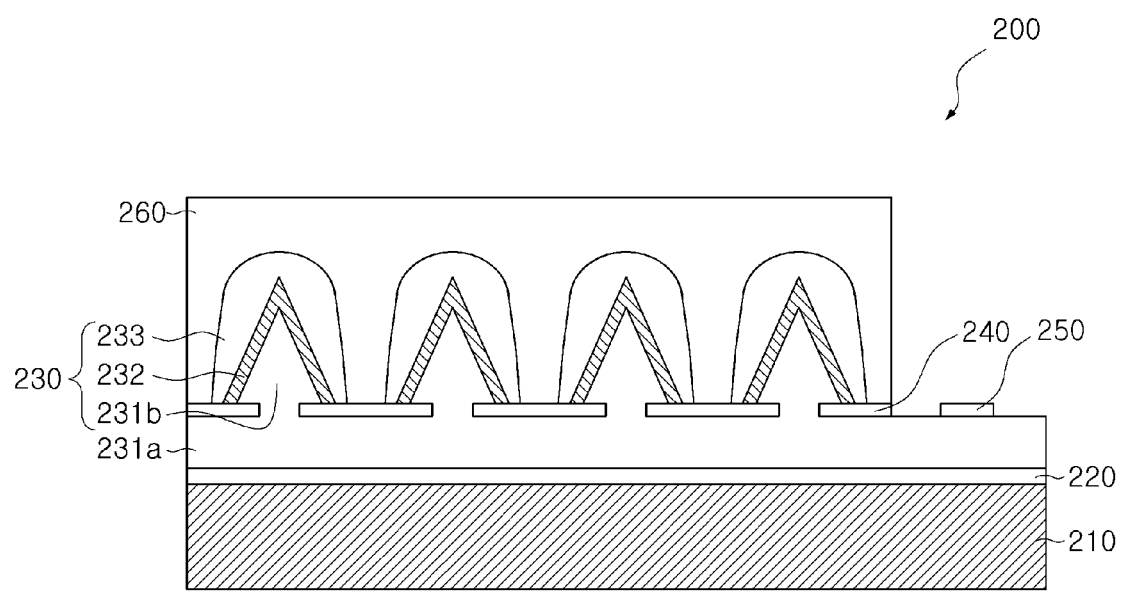
FIG. 8 is a cross-sectional view illustrating another modified example of a semiconductor light emitting device of FIG. 1, according to another embodiment.

FIG. 1 is a cross-sectional view illustrating a semiconductor light emitting device according to one exemplary embodiment. FIG. 8 is a cross-sectional view illustrating a modified example of FIG. 1, according to one embodiment.

As shown in FIG. 1, a semiconductor light emitting device 100 according to one embodiment may include a substrate 110, a first conductivity type semiconductor base layer 131a, and a plurality of light emitting nanostructures 130.

The substrate 110 may be formed, for example, of sapphire, SiC, $MgAl_2O_4$, MgO, $LiAlO_2$, $LiGaO_2$, GaN or the like. In one embodiment, a sapphire substrate is formed of a crystal having Hexa-Rhombo R3c symmetry, and has a lattice constant of 13.001 Å on a C-axis and a lattice constant of 4.758 Å on an A-axis. Orientation planes of the sapphire substrate may include a C (0001) plane, an A (1120) plane, an R (1102) plane, and the like. In particular, the C plane may be used as a substrate for nitride growth as it facilitates the growth of a nitride film and is stable at high temperatures. In certain embodiments, the substrate 110 is prepared for the growth of a buffer layer 120 or the first conductivity type semiconductor base layer 131a. In one embodiment, an unevenness structure may be further formed on a surface of the substrate 110. In the case in which the unevenness structure is formed on the surface of the substrate 110, a light reflection effect in the surface of the substrate 110 may be further improved.

The buffer layer 120 may be formed on the substrate 110. The buffer layer 120 may be provided to address lattice mismatch between the substrate 110 and the first conductivity type semiconductor base layer 131a formed on the substrate 110. The buffer layer 120 may be formed, for example, at low temperatures without doping. In one embodiment, however, the buffer layer 120 may not be formed.

The first conductivity type semiconductor base layer 131a may be formed on the substrate 110 or the buffer layer 120. The first conductivity type semiconductor base layer 131a may be formed, for example, of group III-V semiconductor compounds. In one embodiment, the first conductivity type semiconductor base layer 131a is formed of GaN. The first conductivity type semiconductor base layer 131a may be n-doped. Here, the 'n-doping' process refers to the doping of group V elements. The first conductivity type semiconductor base layer 131a may be, for example, an n-GaN layer.

An insulating film 140 may be formed on the first conductivity type semiconductor base layer 131a. The insulating film 140 may include a plurality of openings 141 formed therein. The plurality of openings 141 may be positioned to correspond to first conductivity type semiconductor cores 131b.

The opening 141 may define the structure of the first conductivity type semiconductor core 131b that is grown using the first conductivity type semiconductor base layer 131a as a seed layer. Specifically, the opening 141 may determine a cross-sectional shape of the first conductivity type semiconductor core 131b. For example, the openings 141 may form a pattern having a circular shape or a polygonal shape including a hexagonal shape. The insulating film 140 may be formed of an insulating material. Specifically, in certain embodiments, the insulating film 140 may be formed of an insulating material selected from the group consisting of $SiO_2$, SiON, $SiN_x$ and a combination thereof.

The light emitting nanostructure 130 may include the first conductivity type semiconductor core 131b, an active layer 132, and a second conductivity type semiconductor layer 133. The plurality of light emitting nanostructures 130 may be provided.

Hereinafter, the first conductivity type semiconductor core 131b, the active layer 132, and the second conductivity type semiconductor layer 133 will be described in detail.

The first conductivity type semiconductor core 131b may be extended from a portion of the first conductivity type semiconductor base layer 131a exposed through the opening and used as the seed layer. In one embodiment, the first conductivity type semiconductor core 131b is formed by the growth of GaN. The cross-sectional shape of the first conductivity type semiconductor core 131b may be, for example, circular or polygonal. In addition, the entirety of the first conductivity type semiconductor core 131b may be formed to have a three-dimensional shape selected from a rod shape, a hexagonal pyramid shape, and a combination thereof. Thus, one end of the each first conductivity type semiconductor core 131b may have, for example, a flat shape, or a pointed shape. As such, the cross-sectional shape of the first conductivity type semiconductor core 131b may be changed depending on the shape of the opening 141 formed in the insulating film 140. In addition, the first conductivity type semiconductor core 131b may be formed as a rod having a quadrangular longitudinal section as shown in FIG. 1, or as a hexagonal pyramid having a triangular longitudinal section as shown in FIG. 8.

The first conductivity type semiconductor core 131b may have a semipolar or non-polar crystalline surface. For example, in the case in which the first conductivity type semiconductor core 131b is formed to have a hexagonal rod shape, it may be a (1-100) plane, and in the case in which the first conductivity type semiconductor core 131b is formed to have a hexagonal pyramid shape, it may have a (1-101) plane.

The active layer 132 may be formed to enclose a surface of the first conductivity type semiconductor core 131b. As shown, the active layer 132 may be conformally formed on the first conductivity type semiconductor core 131b, and may enclose top and lateral surfaces of the first conductivity type semiconductor core 131b. In one embodiment, since the active layer 132 is formed to have a crystalline surface parallel to that of the first conductivity type semiconductor core 131b, the active layer 132 and the first conductivity type semiconductor core 131b have the same crystalline surface. The active layer 132 may have a single quantum well (SQW) structure formed of a single material such as InGaN or the like. Alternatively, the active layer 132 may have a multi-quantum well (MQW) structure in which quantum barrier layers and quantum well layers are alternately laminated. For example, a GaN/InGaN structure may be used. When electrons and holes are recombined in the active layer 132, light energy is generated.

The second conductivity type semiconductor layer 133 may be formed to enclose the active layer 132. The second conductivity type semiconductor layer 133 may be formed to enclose top and lateral surfaces of the active layer 132. The second conductivity type semiconductor layer 133 may be formed, for example, of group III-V semiconductor compounds, which may be the same material as that of the first conductivity type semiconductor core 131b. In one embodiment, the second conductivity type semiconductor layer 133 is p-doped. Here, the "p-doping" process refers to the doping of group III elements. The second conductivity type semiconductor layer 133 may be doped, for example, with Mg impurities. In one embodiment, the second conductivity type semiconductor layer 133 is formed of GaN. The second conductivity type semiconductor layer 133 may be a p-GaN layer. The holes may be moved to the active layer 132 through the second conductivity type semiconductor layer 133.

The second conductivity type semiconductor layer 133 may be etched to separate the individual nanostructures 130 from one another as shown in FIG. 1. In addition, a second conductivity type semiconductor layer 133' may be partially etched to allow the nanostructures 130 to be connected to one another as shown in FIG. 6.

A portion of the second conductivity type semiconductor layer 133 corresponding to the lateral surface of the light emitting nanostructure 130 may have a crystalline surface different from the lateral surface of the first conductivity type semiconductor core 131b.

Figure 6:
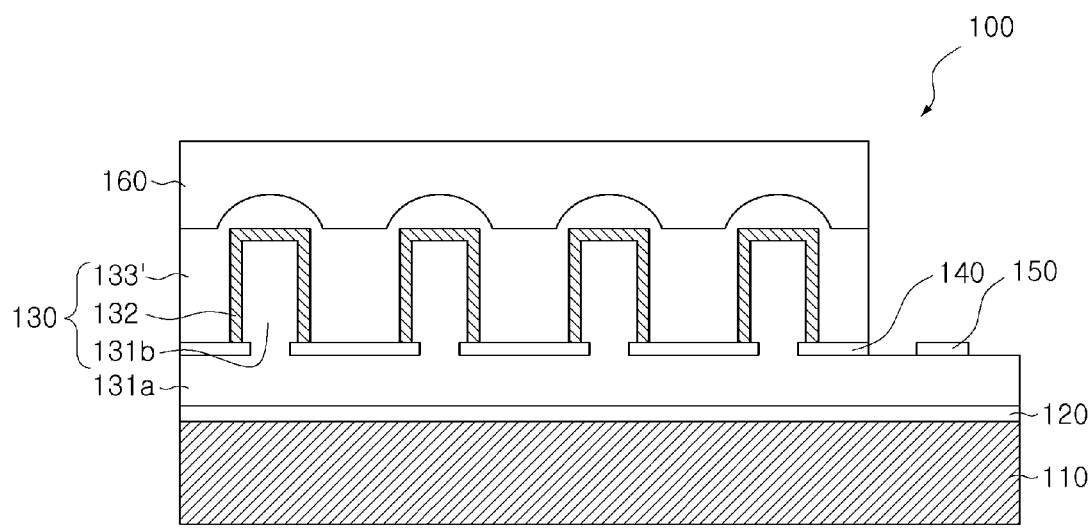
FIGS. 6 and 7 are cross-sectional views illustrating modified examples of the semiconductor light emitting device of FIG. 1, according to certain embodiments.

As can be seen in at least FIGS. 1, 6, and 8, for a specific vertical region or range of each light emitting nanostructure 130 (shown for example as A or B in FIG. 1), an outer surface 130a of the light emitting nanostructure 130 may have a first shape, such as a curved shape, and/or a dome shape. When viewed from a profile view, the outer surface 130a may have a first cross-sectional profile. An outer surface 131c of the first conductivity type core layer 131b may have a second shape, such as a non-curved shape (e.g., straight shape, and/or quadrilateral shape). When viewed from the same profile view, the outer surface 131c may have a second cross-sectional profile different from the first cross-sectional profile.

In the case in which the lateral surface of the second conductivity type semiconductor layer 133 corresponding to the lateral surface of the light emitting nanostructure 130 has a crystalline surface different from the lateral surface of the first conductivity type semiconductor core 131b, light extraction efficiency may be improved.

This will be described in detail with reference to a path of light L1 depicted in FIG. 1. The path of light L1 illustrates that light emitted from the active layer 132 is reflected by a second electrode 160, also referred to herein as a conductive covering layer. In general, since light reflected by a reflective electrode lacks coherent directionality, a large amount of the reflected light is lost within a semiconductor layer. In one embodiment, the second conductivity type semiconductor layer 133 has a dome shape and the second electrode (reflective electrode) 160 is formed thereon, and thus, a concave lens effect may be obtained. Since this structure allows light to be concentrated and reflected, superior light extraction efficiency may be obtained as compared with light reflected without coherent directionality according to the related art.

At least a partial surface or an entire surface of the second conductivity type semiconductor layer 133 may be formed as a curved surface. In the case in which at least a partial surface of the second conductivity type semiconductor layer 133 is formed as a curved surface, the portion of the second conductivity type semiconductor layer 133 corresponding to the lateral surface of the light emitting nanostructure 130 may have such a curved surface. When an angle of inclination between the top surface of the first conductivity type semiconductor base layer 131a and the curved surface of the second conductivity type semiconductor layer 133 is less than that between the top surface of the first conductivity type semiconductor base layer 131a and the lateral surface of the first conductivity type semiconductor core 131b, the reflected light is further concentrated, and thus, a possibility that the reflected light will be incident to the substrate 110 is higher.

The curved surface may form a hemispherical shape such as a dome. In different embodiments, the curved surface may form a dome, and a length of a bottom surface and a height of the dome may be varied.

First and second electrodes 150 and 160 that are used to apply power to the semiconductor light emitting device 100 may be formed on the first conductivity type semiconductor base layer 131a and the second conductivity type semiconductor layer 133, respectively.

In the semiconductor light emitting device 100, in the case in which a predetermined amount of voltage is applied to the first and second electrodes 150 and 160, the electrons from the first conductivity type semiconductor base layer 131a and the holes from the second conductivity type semiconductor layer 133 may be injected into the active layer 132, so that the electrons and the holes may be recombined in the active layer 132, whereby light is generated in the active layer 132.

The first electrode 150 may be formed on the top surface of the first conductivity type semiconductor base layer 131a, and may be formed of a high conductive metal such as Au, Al, Ag or the like or a transparent conductive material. The first electrode 150 may have a multilayer structure including at least two layers.

Figure 7:
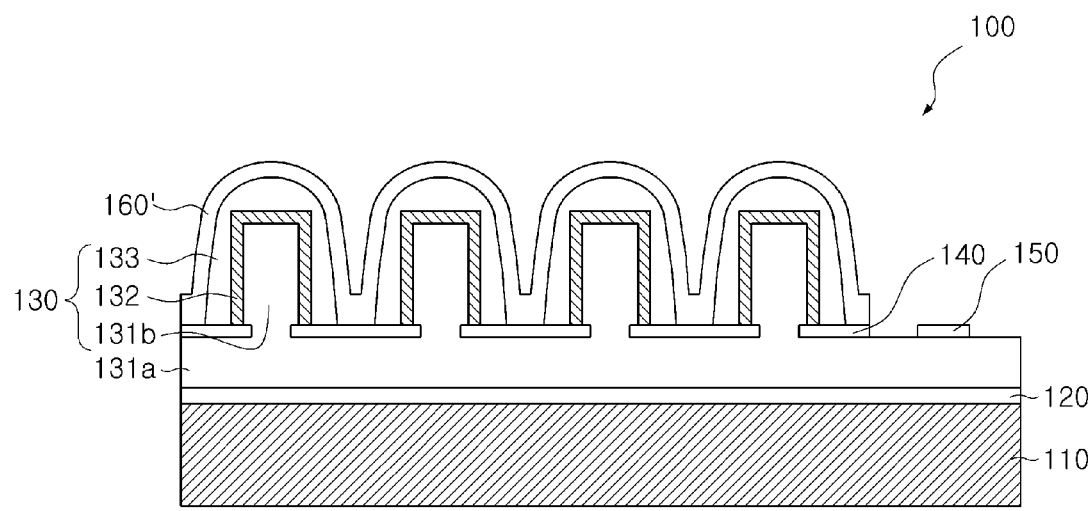

The second electrode 160 may be formed on the second conductivity type semiconductor layer 133. The second electrode 160 may be formed as a reflective electrode or a transparent electrode. In the case in which the second electrode 160 of FIG. 1 is formed as a reflective electrode, the second electrode 160 may be formed of a high reflective metal such as Au, Al, Ag or the like. FIG. 7 illustrates a modified example of one embodiment where a second electrode 160' is formed as a transparent electrode. In the case in which the second electrode 160' is formed as a transparent electrode, the second electrode 160' may be formed of a transparent conductive oxide.

Here, the transparent conductive oxide may be at least one selected from the group consisting of ITO (Indium Tin Oxide), ZITO (Zinc-doped Indium Tin Oxide), ZIO (Zinc Indium Oxide), GIO (Gallium Indium Oxide), ZTO (Zinc Tin Oxide), FTO (Fluorine-doped Tin Oxide), AZO (Aluminium-doped Zinc Oxide), GZO (Gallium-doped Zinc Oxide), $In_4Sn_3O_{12}$ and $Zn_{(1-x)}Mg_xO$ (Zinc Magnesium Oxide, $0 \le x \le 1$).

In the case in which the second electrode 160' is formed as the transparent electrode, the light generated in the active layer 132 may be emitted outwardly through the second electrode 160'. The light generated in the active layer 132 is emitted to pass through an interface between the second conductivity type semiconductor layer 133 and the second electrode 160'. Since the second conductivity type semiconductor layer 133 and the second electrode 160' are formed of different materials, a difference in refractivity is generated.

When two materials having an interface therebetween have refractivity levels n1 and n2, respectively, light passing through the interface satisfies $n1 \sin \theta 1 = n2 \sin \theta 2$ (where, θ1 indicates an angle of incidence, and θ2 indicates an angle of refraction), in accordance with Snell's Law. Here, in the case in which the angle of refraction is greater than 90°, incident light fails to pass through the interface and is reflected inwardly. A point where the angle of incidence of light causes light to be totally reflected inwardly is referred to as a critical angle. The total internal reflection of light is a factor degrading external light extraction efficiency.

In one embodiment, in order to reduce the total internal reflection of light generated in the interface, the surface of the second conductivity type semiconductor layer 133 is formed as a curved surface. In the casein which the interface is formed as the curved surface, a possibility that light may be incident to the interface at an angle less than the critical angle is increased, and thus, an effect of reducing the total internal reflection of light may be expected.

In the case in which the second conductivity type semiconductor layer 133 is formed of GaN, refractivity is approximately 2.5. In the case in which light is emitted into air (refractivity is 1), a critical angle is approximately 23°. Since L1 has an angle less than 23°, light should be totally internally reflected, but it may be emitted through the lateral surfaces of the second conductivity type semiconductor layer 133.

With reference to FIGS. 2 to 5, a method of manufacturing the semiconductor light emitting device 100 will be described. FIGS. 2 to 5 are cross-sectional views illustrating sequential operations in the method of manufacturing the semiconductor light emitting device 100 of FIG. 1.

Figure 2:
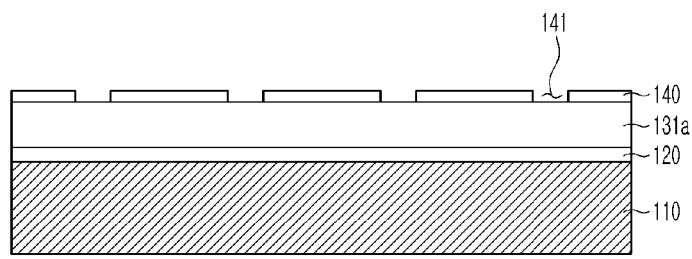
FIGS. 2 through 5 are cross-sectional views illustrating a method of manufacturing the semiconductor light emitting device of FIG. 1, according to one exemplary embodiment.

As shown in FIG. 2, the substrate 110 is prepared and the first conductivity type semiconductor base layer 131a is formed on the substrate 110. Before the first conductivity type semiconductor base layer 131a is formed, the buffer layer 120 may be further formed on the substrate 110. The buffer layer 120 may be, for example, an undoped semiconductor layer. In one embodiment, the buffer layer 120 is formed as an undoped GaN layer.

Next, the insulating film 140 having the plurality of openings 141 is formed on the first conductivity type semiconductor base layer 131a, such that the first conductivity type semiconductor base layer 131a may be selectively exposed through the plurality of openings 141.

The insulating film 140 may prevent contact between the second conductivity type semiconductor layer 133 and the first conductivity type semiconductor base layer 131a. The insulating film 140 includes the plurality of openings 141 through which portions of the first conductivity type semiconductor base layer 131a are exposed. The plurality of openings 141 may have the same diameter. Alternatively, the insulating film 140 may be patterned to form the plurality of openings 141 having different diameters. The plurality of openings 141 may serve to determine the diameters, lengths, and positions of the first conductivity type semiconductor cores 131b to be sequentially grown thereon. The plurality of openings 141 may have, for example, a circular shape, a polygonal shape such as a hexahedral shape, or the like.

Figure 3:
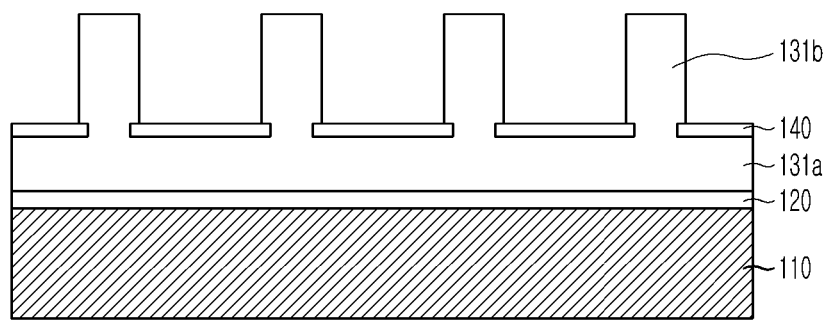

Thereafter, as shown in FIG. 3, the plurality of first conductivity type semiconductor cores 131b may be formed on the first conductivity type semiconductor base layer 131a. The first conductivity type semiconductor cores 131b may be selectively grown through the openings 141, and may be vertically grown from the first conductivity type semiconductor base layer 131a. A cross sectional area of the first conductivity type semiconductor core 131b may be greater than that of the opening 141, and a shape of the first conductivity type semiconductor core 131b may be varied depending on the shape of the opening 141.

Figure 4:
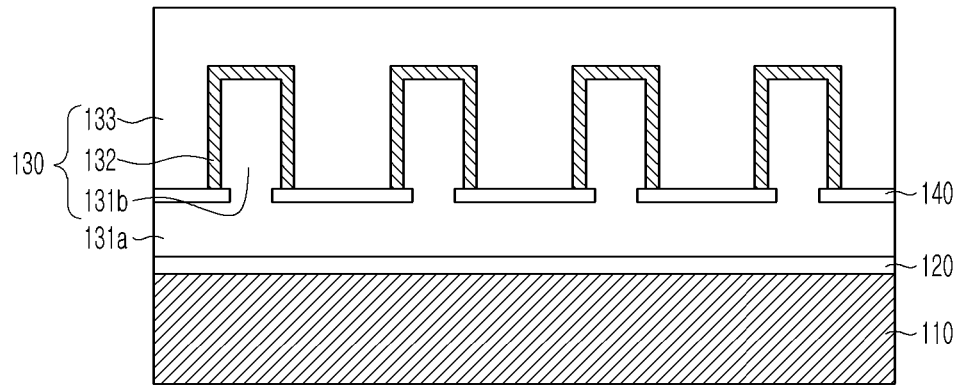
Figure 5:
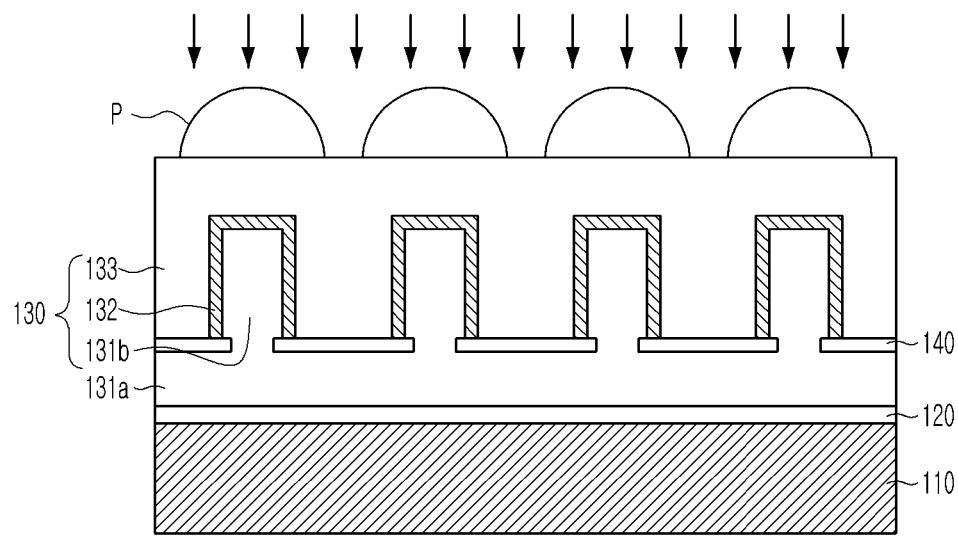

Then, as shown in FIG. 4, the active layer 132 may be formed on the surface of the first conductivity type semiconductor core 131b, and the second conductivity type semiconductor layer 133 may be formed on the active layer 132. The second conductivity type semiconductor layer 133 may be formed to encompass the surface of the active layer 132, while filling a space between the first conductivity type semiconductor cores 131b through epitaxial lateral overgrowth (ELOG). In the case in which the second conductivity type semiconductor layer 133 is overgrown in a lateral direction, dislocations may be reduced and crystallinity may be improved.

The second conductivity type semiconductor layer 133 may be etched to thereby form the light emitting nanostructures 130. The light emitting nanostructures 130 may be formed, for example, by a photolithography process. A photolithography process will be described in detail with reference to FIG. 5.

A photo reactive polymer may be applied to a top surface of the second conductivity type semiconductor layer 133 by a thickness of, for example, 0.1 μm to 5 μm. The photo reactive polymer may be patterned using a mask through photoreaction to thereby form a photoresist pattern P. In consideration of a sequential operation of forming the first electrode 150, in one embodiment, the photoresist pattern P is not formed on a portion of the second conductivity type semiconductor layer 133.

The photoresist pattern P may be formed to include a region of the second conductivity type semiconductor layer 133 corresponding to the first conductivity type semiconductor cores 131b. Here, the photoresist pattern P may be formed on a region including a single first conductivity type semiconductor core 131b or a region including a plurality of first conductivity type semiconductor cores 131b.

Then, the photoresist pattern P may be subjected to a reflow process for approximately one to five minutes at 100° C. to 150° C., and thus, the photoresist pattern P may be formed to have a dome shape.

Then, the photoresist pattern P having the dome shape may be used as a mask, such that a portion of the second conductivity type semiconductor layer 133 may be selectively etched. Here, the etching process may be performed by inductively coupled plasma—reactive ion etching (ICP-RIE) using a Cl$_2$ gas. When the photoresist pattern P having the dome shape is etched, a portion of the second conductivity type semiconductor layer 133 is also etched. Therefore, as shown in FIG. 1, the second conductivity type semiconductor layer 133 has a dome shape while being divided into respective light emitting nanostructures 130.

The etching process may be performed until the insulating film 140 formed on the first conductivity type semiconductor base layer 131a is exposed such that the respective light emitting nanostructures 130 may be separated from one another. However, the etching process may be performed to a depth at which the insulating film 140 remains unexposed, such that the respective light emitting nanostructures 130 may be connected to one another.

Figure 9:
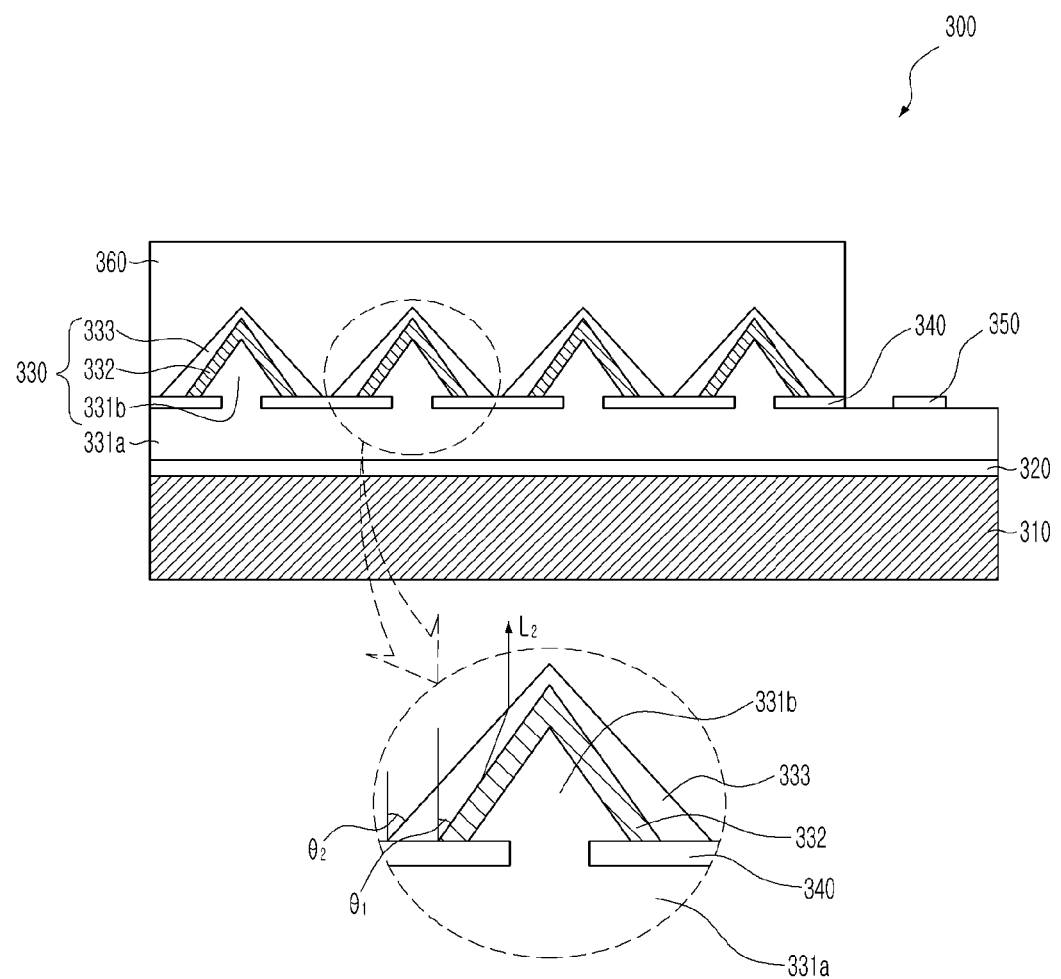
FIG. 9 is a cross-sectional view of a semiconductor light emitting device according to another exemplary embodiment.

With reference to FIG. 9, a semiconductor light emitting device according to another embodiment will be described. FIG. 9 is a cross-sectional view of a semiconductor light emitting device according to another embodiment.

A semiconductor light emitting device 300 according to this embodiment has a configuration similar to that of the semiconductor light emitting device 100 according to the above-described embodiment. The semiconductor light emitting device 300 may include a substrate 310, a first conductivity type semiconductor base layer 331a, and a plurality of light emitting nanostructures 330.

In the embodiment of FIG. 9, a first conductivity type semiconductor core 331b of the light emitting nanostructure 330 may be formed as a polygonal pyramid having a triangular longitudinal section (e.g., a triangular cross-sectional profile). Specifically, the first conductivity type semiconductor core 331b may be formed to have a hexagonal pyramid shape.

A second conductivity type semiconductor layer 333 may have a polygonal pyramid shape similar to that of the first conductivity type semiconductor core 331b, but the second conductivity type semiconductor layer 333 may have a crystalline surface different from a lateral surface of the first conductivity type semiconductor core 331b. Specifically, the second conductivity type semiconductor layer 333 may have a hexagonal pyramid shape. Unlike the second conductivity type semiconductor layer 133 or 233 according to the above-described embodiments, the second conductivity type semiconductor layer 333 may be formed without a separate etching process. The second conductivity type semiconductor layer 333 may be formed by epitaxial lateral overgrowth (ELOG).

In order to allow the first conductivity type semiconductor core 331b and the second conductivity type semiconductor layer 333 to have different crystalline surfaces, an angle of inclination (90°−θ$_2$) between a lateral surface of the second conductivity type semiconductor layer 333 and a top surface of the first conductivity type semiconductor base layer 331a may be set to be less than an angle of inclination (90°−θ$_1$) between the lateral surface of the first conductivity type semiconductor core 331b and the top surface of the first conductivity type semiconductor base layer 331a.

When the angle of inclination (90°−θ$_2$) between the lateral surface of the second conductivity type semiconductor layer 333 and the top surface of the first conductivity type semiconductor base layer 331a is set to be less than that (90°−θ$_1$) between the lateral surface of the first conductivity type semiconductor core 331b and the top surface of the first conductivity type semiconductor base layer 331a, light L2, emitted upwardly of the semiconductor light emitting device 300, of light emitted from an active layer 332, may be incident to the surface of the second conductivity type semiconductor layer 333 at a higher angle of incidence. Therefore, an amount of light totally internally reflected at an interface between the second conductivity type semiconductor layer 333 and a second electrode 360 may be reduced, and thus, external light extraction efficiency may be further improved.

Figure 10:
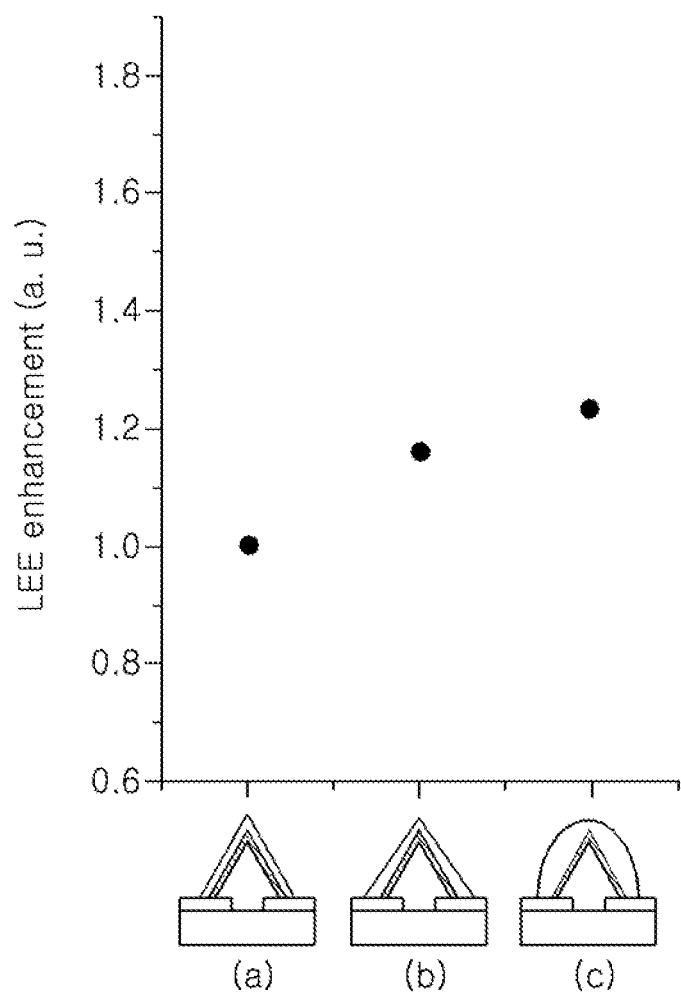
FIG. 10 is a graph illustrating exemplary comparison results of light extraction efficiency between the semiconductor light emitting devices of FIGS. 8 and 9 and a semiconductor light emitting device of comparative example.

This will be described in more detail with reference to FIG. 10. In FIG. 10, (a) indicates a semiconductor light emitting device of comparative example, in which an active layer and a second conductivity type semiconductor layer have the same crystalline surface, and (b) and (c) indicate the semiconductor light emitting devices according to the above-described embodiments. As shown in FIG. 10, light is emitted in an amount of approximately 1.0 a.u. in the case of (a), light is emitted in an amount of approximately 1.15 a.u. in the case of (b), and light is emitted in an amount of approximately 1.25 a.u. in the case of (c). It can be seen that the semiconductor light emitting devices (b) and (c) according to the embodiments discussed herein have improved in terms of the amount of light as compared with the semiconductor light emitting device (a) according to the comparative example.

As set forth above, in a semiconductor light emitting device according to the disclosed embodiments, first and second conductivity type semiconductor layers have different crystalline surfaces (e.g., having different cross-sectional profiles), whereby light extraction efficiency can be further improved.

While the present disclosure has been shown and described in connection with the embodiments, it will be apparent to those skilled in the art that modifications and variations can be made without departing from the spirit and scope of the inventive concept as defined by the appended claims.

What is claimed is:

1. A method of manufacturing a semiconductor light emitting device, the method comprising:
    preparing a substrate;
    forming a first conductivity type semiconductor base layer on the substrate;
    forming an insulating film having a plurality of openings on the first conductivity type semiconductor base layer, the openings allowing the first conductivity type semiconductor base layer to be selectively exposed;
    forming a plurality of first conductivity type semiconductor cores on portions of the first conductivity type semiconductor base layer exposed through the plurality of openings, each of the first conductivity type semiconductor cores formed to have either a rod shape or a pyramid shape, wherein an outer surface of each first conductivity type semiconductor core includes a angled shape;
    forming an active layer on a surface of each of the first conductivity type semiconductor cores; and forming a second conductivity type semiconductor layer on the active layer for each first conductive type semiconductor core to enclose the active layer, the second conductivity type semiconductor layer for each first conductive type semiconductor core having an outer surface that has a curved dome shape;
    wherein each first conductivity type semiconductor core together with a respective active layer and a respective second conductivity type semiconductor layer sequentially formed thereon forms a light emitting nanostructure such that the light emitting device includes a plurality of light emitting nanostructures.

2. The method of claim 1, further comprising:
    forming an electrode on the plurality of light emitting nanostructures, to cover the plurality of light emitting nanostructures, wherein the electrode contacts the second conductive type semiconductor layer for each light emitting nanostructure.

3. The method of claim 2, further comprising:
forming the electrode to contact the insulating film.

4. The method of claim 2, wherein the electrode is a reflective electrode formed of a reflective material that reflects light received from the active layer back toward the active layer.

5. The method of claim 2, wherein the electrode is a transparent electrode formed of a transparent material that permits light received from the active layer to pass through the electrode toward the outside of the semiconductor light emitting device.

6. A method of manufacturing a semiconductor light emitting device, the method comprising:
preparing a substrate;
forming a first conductivity type semiconductor base layer on the substrate;
forming an insulating film having a plurality of openings on the first conductivity type semiconductor base layer such that the first conductivity type semiconductor base layer is disposed between the substrate and the insulating film, the openings allowing the first conductivity type semiconductor base layer to be selectively exposed;
forming a plurality of first conductivity type semiconductor cores on portions of the first conductivity type semiconductor base layer exposed through the plurality of openings;
forming an active layer on a surface of each of the first conductivity type semiconductor cores; and
forming a second conductivity type semiconductor layer on the active layer to enclose at least a first conductivity type semiconductor core and its corresponding active layer,
wherein each first conductivity type semiconductor core together with a respective active layer and a respective second conductivity type semiconductor layer sequentially formed thereon forms a light emitting nanostructure, and
wherein an outer surface of a first conductive type semiconductor core at a first vertical region of a light emitting nanostructure has a first cross-sectional profile, and an outer surface of the second conductivity type semiconductor layer at the first vertical region of the light emitting nanostructure has a second cross-sectional profile different from the first cross-sectional profile, wherein the forming of the second conductivity type semiconductor layer includes:
forming the second conductivity type semiconductor layer while filling a space between the first conductivity type semiconductor cores; and
etching the second conductivity type semiconductor layer so as to allow the outer surface of the second conductivity type semiconductor layer at the first vertical region to have the second cross-sectional profile different from the first cross-sectional profile.

7. The method of claim 6, wherein the etching of the second conductivity type semiconductor layer includes:
forming a photoresist pattern having a desired shape on the second conductivity type semiconductor layer in positions corresponding to the first conductivity type semiconductor cores; and
etching the second conductivity type semiconductor layer together with the photoresist pattern so as to divide the second conductivity type semiconductor layer into respective light emitting nanostructures.

8. The method of claim 7, wherein the etching of the second conductivity type semiconductor layer is performed until the insulating film is exposed, such that the second conductivity type semiconductor layer is divided into respective light emitting nanostructures.

\* \* \* \* \*